(12) United States Patent
Rossignol et al.

(10) Patent No.: US 12,028,981 B2
(45) Date of Patent: Jul. 2, 2024

(54) SECURE ELECTRONIC CIRCUIT AND CORRESPONDING ASSEMBLY PROCESS

(71) Applicant: BANKS AND ACQUIRERS INTERNATIONAL HOLDING, Paris (FR)

(72) Inventors: Michel Rossignol, Montelege (FR); Xavier Lambert, Rueil Malmaison (FR); Lilian Vassy, Albon (FR); Christophe Curinier, Charpey (FR)

(73) Assignee: BANKS AND ACQUIRERS INTERNATIONAL HOLDING, Paris (FR)

( * ) Notice: Subject to any disclaimer, the term of this patent is extended or adjusted under 35 U.S.C. 154(b) by 267 days.

(21) Appl. No.: 17/625,959

(22) PCT Filed: Jul. 8, 2020

(86) PCT No.: PCT/EP2020/069233
§ 371 (c)(1),
(2) Date: Jan. 10, 2022

(87) PCT Pub. No.: WO2021/008965
PCT Pub. Date: Jan. 21, 2021

(65) Prior Publication Data
US 2022/0248536 A1 Aug. 4, 2022

(30) Foreign Application Priority Data

Jul. 12, 2019 (FR) ........................................ 1907842

(51) Int. Cl.
*H05K 1/18* (2006.01)
*H05K 1/02* (2006.01)
*H05K 3/34* (2006.01)

(52) U.S. Cl.
CPC .......... *H05K 1/181* (2013.01); *H05K 1/0275* (2013.01); *H05K 3/3436* (2013.01); *H05K 2201/1031* (2013.01); *H05K 2201/10734* (2013.01)

(58) Field of Classification Search
CPC ........ H05K 1/181; H05K 1/182; H05K 1/183; H05K 3/34; H05K 3/341; H05K 1/0275
See application file for complete search history.

(56) References Cited

U.S. PATENT DOCUMENTS

| | | | |
|---|---|---|---|
| 8,552,566 B1 | 10/2013 | Zeta et al. | |
| 8,796,835 B2 * | 8/2014 | Kim | ...................... H01L 25/105 257/E25.027 |

(Continued)

FOREIGN PATENT DOCUMENTS

JP   H11121899 A   4/1999

OTHER PUBLICATIONS

English translation of the Written Opinion of the International Searching Authority dated Sep. 3, 2020 for corresponding International Application No. PCT/EP2020/069233, filed Jul. 8, 2020.

(Continued)

*Primary Examiner* — Hoa C Nguyen
(74) *Attorney, Agent, or Firm* — David D. Brush; Westman, Champlin & Koehler, P.A.

(57) ABSTRACT

An electronic circuit, which includes: a printed circuit, at least one first electronic component and at least one second electronic component. The at least one first electronic component includes an interconnection face provided with electrical interconnections brazed on an external face of the printed circuit. The interconnection face is opposite the external face. The brazed electrical interconnections form at least one space between the interconnection face and the external face. The at least one second electronic component (Continued)

is brazed on the external face and is at least partly housed in the at least one space.

8 Claims, 2 Drawing Sheets

(56) References Cited

U.S. PATENT DOCUMENTS

| | | | |
|---|---|---|---|
| 9,355,939 B2* | 5/2016 | Cho | H01L 23/495 |
| 9,443,743 B1 | 9/2016 | Yeh et al. | |
| 2004/0256133 A1 | 12/2004 | Dishongh et al. | |
| 2008/0001307 A1* | 1/2008 | de Mevergnies | H05K 1/181 |
| | | | 257/778 |

OTHER PUBLICATIONS

International Search Report dated Aug. 26, 2020 for corresponding International Application No. PCT/EP2020/069233, Jul. 8, 2020.
Written Opinion of the International Searching Authority dated Aug. 26, 2020 for corresponding International Application No. PCT/EP2020/069233, filed Jul. 8, 2020.
French Search Report and Written Opinion with English machine translation dated May 5, 2020 for corresponding French Application No. 1907842, filed Jul. 12, 2019.

* cited by examiner

[Fig. 1a]
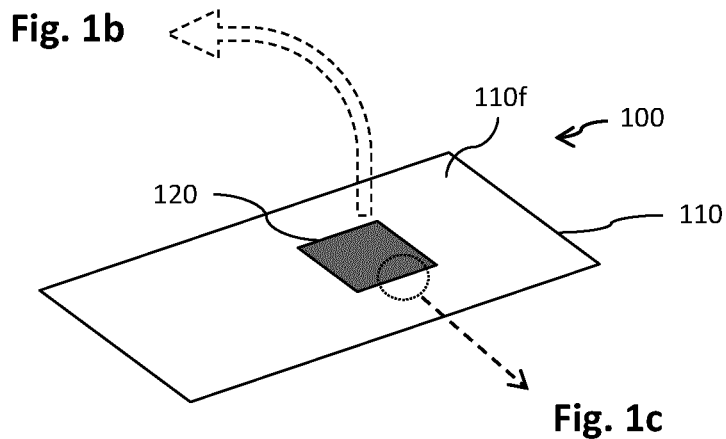
[Fig. 1b]
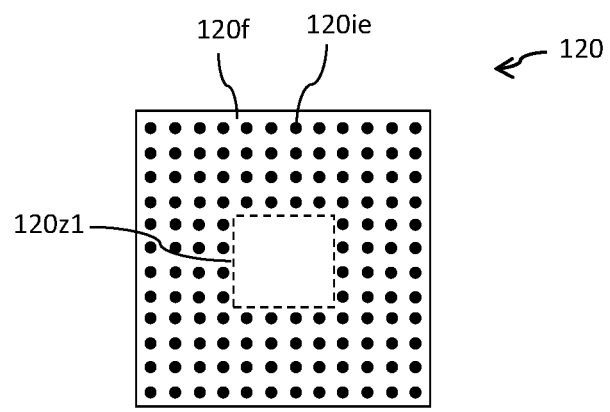
[Fig. 1c]
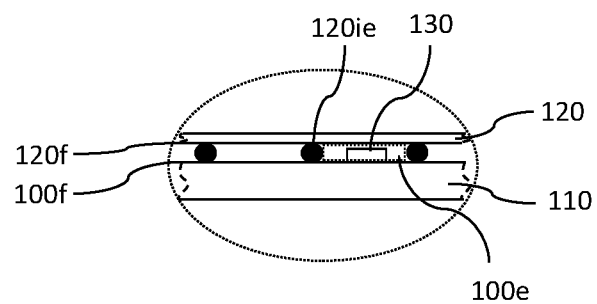

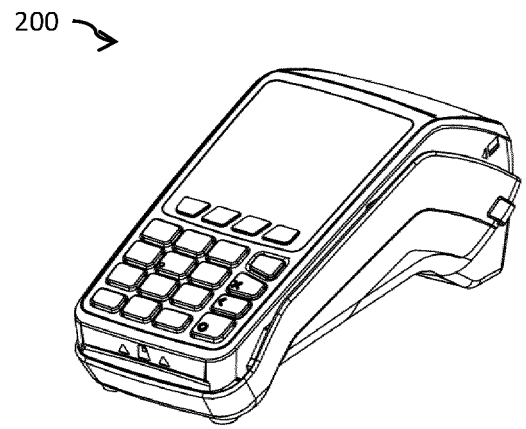
[Fig. 2]
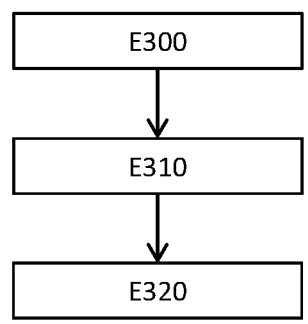
[Fig. 3]

US 12,028,981 B2

SECURE ELECTRONIC CIRCUIT AND CORRESPONDING ASSEMBLY PROCESS

CROSS-REFERENCE TO RELATED APPLICATIONS

This Application is a Section 371 National Stage Application of International Application No. PCT/EP2020/069233, filed Jul. 8, 2020, which is incorporated by reference in its entirety and published as WO 2021/008965 A1 on Jan. 21, 2021, not in English.

FIELD OF THE INVENTION

The field of the invention is that of electronic circuits comprising electronic components brazed onto a printed circuit.

More precisely, the invention relates to the securing and improvement of the performance of such an electronic circuit.

In the remainder of the description, the terms "soldering" ("soldered") and "brazing" ("brazed") are used in an undifferentiated manner.

The use of such electronic circuits is very widespread in industry. Moreover, numerous fields require high security levels in terms of confidentiality of the electrical signals passing through the equipment. The invention thus has numerous applications, in particular, but not exclusively, in the fields of electronic payment terminals, payment card readers, etc.

PRIOR ART AND DRAWBACKS THEREOF

The intention in the remainder of this document is more particularly to describe a problem existing in the field of payment terminals with which the inventors of the present patent application have been confronted. The invention is of course not limited to this particular field of application, but has an advantage for securing and improving the performance of electronic circuits that can be used in any type of electronic device.

In order to improve the electrical performance of microprocessors, and therefore the reliability of the end electronic product, the use of external components (e.g. filtering capacitors, resistor, etc.) is necessary. However, in some applications, such microprocessors are required to process sensitive signals, i.e. signals representing sensitive data. This is for example the case in payment terminals wherein one (or more) secure processor processes sensitive data (e.g. a personal identification code, or PIN, transaction data, etc.).

In this case, the use of external components in order, for example, to filter the sensitive signals entering or leaving the secure processor give, via their input/output ports, a point of access to the sensitive signals in question. The sensitive signals may thus be spied on, for example via the use of a voltage probe or other.

In order to limit such access, the technique described in the patent document U.S. Pat. No. 9,443,743 B1 proposes, via the use of a multilayer printed circuit, burying the external components. In this way, it becomes more difficult to access the signals processed by the external components in question.

However, such a technique remains expensive to implement since it requires a particular method for assembling components in the integrated circuit.

There is thus a need for a technique for securing an electronic circuit by limiting access to all or some of the electrical signals processed by the electronic components that make it up.

There is a need for such a technique to also make it possible to improve the electrical performance of the circuit.

DESCRIPTION OF THE INVENTION

In one embodiment of the invention, an electronic circuit is proposed comprising:
  a printed circuit;
  at least one first electronic component comprising a face, referred to as an interconnection face, provided with electrical interconnections brazed on an external face of the printed circuit. The interconnection face is opposite the external face. The brazed electrical interconnections form at least one space between the interconnection face and the external face; and
  at least one second electronic component brazed on the external face.

Said at least one second electronic component is at least partly housed in said at least one space.

Thus the invention proposes a novel and inventive solution for improving the security of the aforementioned electronic circuit. To do this, the technique proposed takes advantage of the space existing between the interconnection face of the first electronic component and the external face of the printed circuit on which the first electronic component is brazed. The second electronic component or components being disposed in the space in question, access to the signals that they process is restricted. The securing of the electronic circuit is thus improved. For example, the first electronic component is a secure microprocessor processing sensitive data and packaged in a package of the BGA ("Ball Grid Array") type or CSP ("Chip Scale Package") type. The second electronic component or components are dedicated for example to processing the sensitive signals (i.e. to processing the electrical signals conveying sensitive information processed by the processor). Access to the sensitive signals, e.g. spying thereon via a voltage probe, is thus restricted.

According to one embodiment, the interconnection face comprises:
  a first zone of maximum area among the zones having a convex external boundary and not comprising any of the electrical interconnections; and
  a second zone, complementary to the first zone on the interconnection face, comprising the electrical interconnections.

Said at least one space is located in the second zone.

Thus the second component or components are placed as close as possible to the electrical interconnections. In this way, the processing implemented by the second component or components on the corresponding signals is improved (e.g. when the signals in question enter or leave the first component via certain electrical interconnections), and therefore the performance of the electronic circuit also.

According to one embodiment, the electrical interconnections comprise at least four electrical interconnections substantially equally distributed around said at least one second electronic component.

Thus access to the signals processed by the second component or components is restricted from all sides, thereby improving the protection of the electronic circuit.

According to one embodiment, said at least four electrical interconnections are substantially disposed at equal distances from said at least one second electronic component.

According to one embodiment, said at least one first electronic component belongs to the group comprising:
- an integrated circuit with BGA package; and
- an integrated circuit with CSP package.

According to one embodiment, the electrical interconnections belong to the group comprising:
- fusible balls, the electrical interconnections having been brazed on the external face by refusion of the electrical interconnections; or
- non-fusible balls, the electrical interconnections having been brazed on the external face by refusion of a brazing paste.

According to one embodiment, said at least one second electronic component is of the surface-mounted type.

In one embodiment of the invention, an electronic terminal is proposed comprising at least one electronic circuit according to any one of the aforementioned embodiments.

In one embodiment of the invention, a method is proposed for assembling an electronic circuit according to any one of the aforementioned embodiments. Such a method comprises:
- a placing of at least one second electronic component on an external face of a printed circuit;
- a placing of at least one first electronic component on the external face of the printed circuit, said at least one first electronic component comprising a face, referred to as an interconnection face, provided with electrical interconnections. The interconnection face is disposed opposite the external face when said at least one first electronic component is placed.

The electrical interconnections form at least one space between the interconnection face and the external face;
- a brazing, on the external face, of said at least one second electronic component and of said at least one first electronic component after the aforementioned placings. The brazing comprises a brazing of the electrical interconnections on the external face of the printed circuit.

Said at least one second electronic component is at least partly housed in said at least one space.

Thus the features and advantages of this assembly method are the same as those of the electronic circuit described previously. Consequently they are not detailed more fully.

LIST OF FIGURES

Other aims, features and advantages of the invention will emerge more clearly from the reading of the following description, given by way of simple illustrative and non-limitative example, in relation to the figures, among which:

FIG. 1a illustrates an electronic circuit comprising a first electronic component brazed on an external face of a printed circuit according to one embodiment of the invention;

FIG. 1b illustrates the face of the first electronic component of FIG. 1 provided with electrical interconnections;

FIG. 1c illustrates a zoom on the space existing between the face of the first component provided with electrical interconnections and the external face of the printed circuit of FIG. 1a;

FIG. 2 illustrates a payment terminal comprising the electronic circuit of FIG. 1a; and FIG. 3 illustrates the steps of a method for assembling the electronic circuit of FIG. 1 according to an embodiment of the invention.

DETAILED DESCRIPTION OF EMBODIMENTS OF THE INVENTION

The general principle of the invention is based on the re-use of a space (or a plurality of spaces) located between firstly the face of a first electronic component (e.g. a processor) provided with electrical interconnections brazed on an external face of a printed circuit and, secondly, the external face in question. According to the present technique, such a space is re-used for housing an external component (or a plurality of external components) (e.g. a component processing a signal conveying sensitive information processed by the processor) brazed on the external face of the printed circuit. Access to the signals processed by the external component is thus restricted.

Securing of the electronic circuit is thereby improved.

An electronic circuit 100 comprising a first electronic component 120 brazed on an external face 110$f$ of a printed circuit 110 according to one embodiment of the invention is now presented in relation to FIG. 1a. Such an electronic circuit 100 is described later in relation to firstly FIG. 1b, which illustrates the face 120$f$ of the first electronic component 120 provided with electrical interconnections 120$ie$ and secondly FIG. 1c, which illustrates a zoom (seen from the edge of the printed circuit 110) on the space 100$e$ existing between the interconnection face 120$f$ of the first component 120 and the external face 110$f$ of the printed circuit 110.

More particularly, the electronic circuit 100 comprises:
- the printed circuit 110;
- the first electronic component 120 comprising the face 120$f$ provided with electrical interconnections 120$ie$ brazed on the external face 110$f$ of the printed circuit 110; and
- a second electronic component 130 brazed on the external face 110$f$.

The interconnection face 120$f$ is facing the external face 110$f$. The electrical interconnections 120$ie$ brazed on the external face 110$f$ of the printed circuit 110 form a space 100$e$ between the interconnection face 120$f$ and the external face 110$f$. The second electronic component 130 is housed in the space 100$e$. In this way, access to the signals processed by the second electronic component 130 is restricted. Securing of the electronic circuit 100 is thus improved.

The space 100$e$ results from the configuration of the electrical interconnections 120$ie$. In the embodiment illustrated, the first electronic component 120 is an integrated circuit having a BGA package. In other embodiments, the first electronic component 120 is an integrated circuit having a CSP package. In yet other embodiments, the first electronic component is an electronic component the package of which comprises electrical interconnections configured to form a space such as the space 100$e$ once the component in question is placed on the external face 110$f$ of the printed circuit.

In embodiments, the electrical interconnections 120$ie$ are fusible balls (in this case the electrical interconnections 120$ie$ are for example brazed on the external face 110$f$ by refusion of the electrical interconnections 120$ie$ and a brazing paste). In other embodiments, the electrical interconnections 120$ie$ are non-fusible balls (in this case the electrical interconnections 120$ie$ are for example brazed on the external face 110$f$ e.g. by refusion of a brazing paste).

Returning to FIG. 1a, FIG. 1b and FIG. 1c, the space 100e between the interconnection face 120f of the BGA package and the external face 110f of the printed circuit 110 makes it possible to house the second component 130.

In embodiments, the second component 130 is a passive electronic component having a package having dimensions making it possible to house it in the space 100e. For example, the second component 130 is a surface-mounted component, or SMC, of the 01005 type (here 01 designates the length of the component, i.e. 16/1000 inches, or 400 µm, and 005 designates the width of the component, i.e. 8/1000 inches, or 200 µm).

In general terms, the space 100e wherein the second component 130 is housed is located anywhere between the interconnection face 120f and the external face 110f. This is because, whatever the location chosen between the two faces 120f and 110f, access to the signals processed by the second component (e.g. spying thereon via a voltage probe) is restricted by the presence of the first component 120 on top (relatively to the external face 110f) of the second component 130.

In some embodiments, the space 100e wherein the second component 130 is housed is located in a zone dense with electrical interconnections 120ie. For example, reconsidering the case of a BGA package as illustrated in FIG. 1b, the space 100e wherein the second component 130 is housed is located at the periphery of the first component 120. In other words, if on the interconnection face 120f there are defined:
a first zone 120z1 of maximum area among the zones having a convex external boundary and not comprising any of the electrical interconnections 120ie; and
a second zone, complementary to the first zone 120z1 on the interconnection face 120f, and comprising the electrical interconnections 120ie,
the space 100e is selected in the second zone. Thus the second component 130 is placed as close as possible to the electrical interconnections 120ie. In this way, the processing implemented by the second component 130 on the corresponding signals is improved (e.g. when the signals in question enter or leave the first component 120 via certain electrical interconnections 120ie), and therefore the performance of the electronic circuit 100 also.

In some embodiments, the electrical interconnections 120ie comprise at least four electrical interconnections substantially equally distributed around the second electronic component 130.

Thus access to the signals processed by the second component 130 is restricted from all sides, thereby improving further the securing of the electronic circuit 100.

In some embodiments, the at least four electrical interconnections in question are substantially disposed at equal distances from the second electronic component 130.

In some embodiments, a plurality of second electronic components 130 are disposed in the space 100e.

In some embodiments, the configuration of the interconnections 120ie of the package of the first component 120 makes it possible to define a plurality of spaces 100e. In variants, the second electronic component 130 is at least partly housed in one of the spaces 100e. In other variants, a plurality of second electronic components 130 are housed at least partly in one or more of the spaces 100e.

Such an electronic circuit 100 (according to any one of the aforementioned embodiments) is for example installed in an electronic payment terminal as illustrated on FIG. 2.

The steps of a method for assembling the electronic circuit 100 (according to any one of the aforementioned embodiments) according to one embodiment of the invention is now presented in relation to FIG. 3.

In a step E300, the second electronic component (or components) 130 is placed on the external face 110f.

In a step E310, the first electronic component (or components) 120 is also placed on the external face 110f. More particularly, the interconnection face 120f is disposed facing the external face 110f and the electrical interconnections 120ie form the space (or the spaces) 100e between the interconnection face 120f and the external face 110f wherein the second electronic component (or components) 130 previously placed on the external face 110f is housed.

In a step E330, the second electronic component (or components) 130 and the first electronic component (or components) 120 placed are brazed on the external face 110f. In particular, the electrical interconnections 120ie are brazed on the external face 110f of the printed circuit 110.

In some embodiments, the brazing is obtained by stoving the printed circuit 110 on which the second electronic component (or components) 130 and the first electronic component (or components) 120 are placed.

In some embodiments, screen printing of brazing paste is first of all implemented at the locations at which the second electronic component (or components) 130 and the first electronic component (or components) 120 must be placed. In this way, a refusion of the brazing paste in question is obtained when the step E320 is implemented in order to braze on the external face 110f the second electronic component (or components) 130 and the first electronic component (or components) 120.

In some embodiments, the second electronic component (or components) 130 and the first electronic component (or components) 120 are of a type as described above in the various embodiments discussed in relation to FIG. 1a, FIG. 1b and FIG. 1c (e.g. first electronic component 120 is an integrated circuit having a BGA or CSP package, etc.).

In some embodiments, the second electronic component (or components) 130 and the first electronic component (or components) 120 are placed on the external face 110f so as to obtain a relative positioning of the second electronic component (or components) 130 with respect to the electrical interconnections 120ie as described above in the various embodiments discussed in relation to FIG. 1a, FIG. 1b and FIG. 1c (e.g. space 100e selected in the second zone, four electrical interconnections substantially equally distributed around the second electronic component 130, etc.).

The features and advantages of the steps of the assembly method according to the technique described are therefore the same as for the electronic circuit 100 (according to any one of the aforementioned embodiments) and are therefore not detailed further.

The invention claimed is:
1. An electronic circuit comprising:
a printed circuit;
at least one first electronic component comprising an interconnection face provided with electrical interconnections brazed on an external face of said printed circuit, said interconnection face being opposite said external face, said interconnection face comprising:
a first zone of maximum area among zones having a convex external boundary and not comprising any of the electrical interconnections; and
a second zone, complementary to the first zone on the interconnection face, comprising the electrical interconnections, said brazed electrical interconnections forming at least one space between said interconnection face and said external face; and at least one second electronic component brazed on said external face, said second electronic component being configured to process sensitive data; wherein said at least one second electronic component is at least partly housed in the second zone in a space of said at least one space.

2. The electronic circuit according to claim 1, wherein said electrical interconnections comprise at least four electrical interconnections substantially equally distributed around said at least one second electronic component.

3. The electronic circuit according to claim 2, wherein said at least four electrical interconnections are substantially disposed at equal distances from said at least one second electronic component.

4. The electronic circuit according to claim 1, wherein said at least one first electronic component belongs to the group consisting of:

an integrated circuit with BGA ("Ball Grid Array") package; and an integrated circuit with CSP ("Chip Scale Package") package.

5. The electronic circuit according to claim 4, wherein said electrical interconnections belong to the group consisting of:

fusible balls, said electrical interconnections having been brazed on said external face by refusion of said electrical interconnections; or non-fusible balls, said electrical interconnections having been brazed on said external face by refusion of a brazing paste.

6. The electronic circuit according to the claim 1, wherein said at least one second electronic component is of the surface-mounted type.

7. An electronic terminal comprising at least one electronic circuit according to claim 1.

8. A method for assembling an electronic circuit, the method comprising:

placing at least one second electronic component on an external face of a printed circuit, said second electronic component being configured to process sensitive data;

placing at least one first electronic component (on said external face of said printed circuit, said at least one first electronic component comprising an interconnection face provided with electrical interconnections, said interconnection face comprising:

a first zone of maximum area among the zones having a convex external boundary and not comprising any of the electrical interconnections; and second zone, complementary to the first zone on the interconnection face, comprising the electrical interconnections, said interconnection face being disposed opposite said external face when said at least one first electronic component is placed, said electrical interconnections forming at least one space between said interconnection face and said external face;

brazing, on said external face, said at least one second electronic component and said at least one first electronic component after said placings, said brazing comprising brazing the electrical interconnections on the external face of said printed circuit, wherein said at least one second electronic component is at least partly housed in the second zone in a space of said at least one space.

* * * * *